(12) United States Patent
Hisamatsu et al.

(10) Patent No.: US 6,504,091 B2
(45) Date of Patent: Jan. 7, 2003

(54) PHOTOELECTRIC CONVERTING DEVICE

(75) Inventors: Tadashi Hisamatsu, Kashihara (JP); Kazuyo Nakamura, Kitakatsuragi-gun (JP); Yuji Komatsu, Kitakatsuragi-gun (JP); Masafumi Shimizu, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/779,827

(22) Filed: Feb. 9, 2001

(65) Prior Publication Data
US 2001/0018924 A1 Sep. 6, 2001

(30) Foreign Application Priority Data

Feb. 14, 2000 (JP) ........................ 2000-034896

(51) Int. Cl.$^7$ ....................... H01L 31/04; H01L 31/0256
(52) U.S. Cl. ................... 136/262; 136/255; 136/261
(58) Field of Search ................. 136/262, 255, 136/261, 249, 252; 257/200, 183, 184, 461, 104

(56) References Cited

U.S. PATENT DOCUMENTS

| 4,094,704 A | * | 6/1978 | Milnes .................. 136/244 |
| 4,235,651 A | * | 11/1980 | Kamath et al. ............. 117/58 |
| 4,835,116 A | * | 5/1989 | Lee et al. ................. 117/89 |
| 5,223,043 A | | 6/1993 | Olson et al. ............... 136/249 |
| 5,405,453 A | | 4/1995 | Ho et al. .................. 136/249 |
| 5,944,913 A | * | 8/1999 | Hou et al. ................. 136/255 |
| 6,340,788 B1 | * | 1/2002 | King et al. ................ 136/261 |

OTHER PUBLICATIONS

Karam et al. "Development and Characterization of High –Efficiency GaO.5InO.5P/GaAs/Ge Dual– and Triple–Junction Solar Cells." IEEE Transactions on Electron Devices, vol. 46, No. 10, Oct. 1999. pp. 2116–2125.*

Dimroth et al. "25.5% Efficient Ga0.35ln0.65/Ga0.83In0.17As Tandem Solar Cells Grown on GaAs Substrates." IEEE Electron Device Letters, vol. 21, No. 5, May 2000. pp. 209–211.*

T. Takamoto et al.; "High Efficiency InGaP/In0.01Ga0.99As Tandem Solar Cells Lattice–matched to Ge Substrates" Technical Digest of the International PVSEC–11, Sapporo, Hokkaido, Japan, 1999, pp. 593–594.

Matthias E. Nell et al.; "The Spectral p–n Junction Model for Tandem Solar–Cell Design" IEEE Transactions on Electron Devices, vol. ED–34, No. 2, Feb. 1987, pp. 257–266.

* cited by examiner

*Primary Examiner*—Nam Nguyen
*Assistant Examiner*—Brian L Mutschler
(74) *Attorney, Agent, or Firm*—Nixon & Vanderhye P.C.

(57) ABSTRACT

A photoelectric converting device is provided with enhanced photoelectric conversion efficiency by optimizing a combination of materials used for top and bottom cells. The photoelectric converting device of the present invention is provided with first and second pn junctions. The first pn junction is formed in a semiconductor substantially represented by $(Al_{1-y}Ga_y)_{1-x}In_xP$, and the second pn junction is formed in a semiconductor substantially represented by $Ga_{1-z}In_zAs$.

12 Claims, 12 Drawing Sheets

PHOTOELECTRIC CONVERTING DEVICE

BACKGROUND OF THE INVENTION

1. Field of the Invention

The present invention relates to photoelectric converting devices for converting light energy to electrical energy and, more particularly to a photoelectric converting device using a Group III–V compound semiconductor with enhanced photoelectric conversion efficiency for converting solar light energy to electrical energy especially for use in outer space.

2. Description of the Background Art

In recent years, a greater number of multi-junction solar cells mainly including semiconductors of a Group III–V compound such as GaAs are used as solar cells for outer space of a power supply source for a space craft such as a space satellite. Such solar cells can provide greater photoelectric conversion efficiency as compared with conventional silicon solar cells which have been widely used as solar cells for outer space. As such, silicon cells are suitable for use in a small satellite or a superpower satellite.

The most popular multi-junction solar cell is of the type disclosed for example in U.S. Pat. Nos. 5,223,043 and 5,405,453. The structure of such a solar cell is shown in FIG. 20. The conventional multi-junction (two-junction) cell mainly includes a first solar cell (hereinafter referred to as "a top cell") 104 of $Ga_{1-x}In_xP$ formed on the solar light incidence side and a second solar cell (hereinafter referred to as "a bottom cell") of GaAs below the top cell, which are connected by a tunnel junction 103. GaAs or Ge single-crystal wafer is used as a substrate 101. For a composition ratio of $Ga_{1-x}In_xP$ of the top cell, x equals to 0.49 for the purpose of providing lattice matching with GaAs of the bottom cell. In this case, the lattice constants of the top and bottom cells are designed to be approximately equal to that of Ge of the substrate and to enable epitaxial growth on the Ge substrate relatively easily. Then, the bandgap Eg of the top cell is about 1.9 eV, and that of the bottom cell is about 1.4 eV. The conventional multi-junction solar cell has attained about 26% and about 22%, respectively at experimental and industrial product levels, as a result of characteristic testing using a light source as a solar light spectrum in outer space. Recently, a three-junction solar cell has been developed which has a pn junction also for a Ge substrate in addition to top and bottom cells.

To keep up with a dramatic progress in recent space development, the above mentioned photoelectric conversion efficiency is insufficient and higher conversion efficiency is desired. The above described conventional multi-junction solar cell has been developed from a GaAs solar cell formed on a Ge substrate, leading to the above described structure. In terms of solar energy efficiency, however, the combination of $Ga_{1-x}In_xP$ and GaAs is not optimum for the following reasons.

The theoretical photoelectric conversion efficiency of a solar cell having two pn junctions is described for example in an article in *IEEE Transactions on Electron Devices. ED*-34, p257. The article shows a relationship between the expected value of photoelectric conversion efficiency and a range of the bandgaps of top and bottom cells based on matching of the bandgaps of top and bottom cells and incident light spectrum. In practically manufacturing a solar cell, lattice matching between top and bottom cells as well as between the bottom cell and the substrate must be achieved to provide a high-quality epitaxial layer. FIG. 21 shows a relationship between a lattice constant and a bandgap energy for various semiconductor materials. Based on the above mentioned article, FIG. 21 shows bandgap ranges U and L respectively for the top and bottom cells to achieve a conversion efficiency of at least 30% with respect to a solar light spectrum (AMO) in outer space. The graph shows that the combination of the materials used for the above described conventional multijunction solar cell, i.e., the combination of $Ga_{1-x}In_xP$ and GaAs, merely provides the photoelectric conversion efficiency of no more than 30%.

SUMMARY OF THE INVENTION

An object of the present invention is to provide a photoelectric converting device capable of providing increased photoelectric conversion efficiency by optimizing a combination of materials for top and bottom cells.

A photoelectric converting device of the present invention is provided with first and second pn junctions. The first and second pn junctions are substantially formed in semiconductors respectively represented by $(Al_{1-y}Ga_y)_{1-x}In_xP$ and $Ga_{1-z}In_zAs$.

To achieve a convention efficiency of at least 30%, it has been said that at least the following conditions must be met.

(a) Optimization of a combination of a material for a top cell (hereinafter referred to as "a top cell material") and a material for a bottom cell (hereinafter referred to as "a bottom cell material").

(b) Lattice matching between the top and bottom cell materials.

(c) Lattice matching between the bottom cell and substrate materials.

(d) Matching of thermal expansion coefficients between a layer and substrate materials.

However, it is difficult to find a combination of semiconductor materials which satisfy all of these conditions and which are still inexpensive. The extensive study of each of the above conditions conducted by the present inventors have confirmed that the above conditions (a) and (b) are indispensable to provide a conversion efficiency of at least 30%.

However, the following finding was also obtained. Namely, lattice matching between the bottom cell and substrate materials are not very important, and lattice mismatching of at most about 4% can still provide a layer with good crystallinity by a crystal growth technique. (This condition, an alleviation of (c), will be hereinafter represented as (c')).

In addition, the following finding was obtained. Matching of thermal expansion coefficients between the layer and the substrate materials is not extremely important either and, as long as the thermal expansion coefficient of the layer is at most that of the substrate, the problem of cracks to the layer caused by the difference in thermal expansion coefficient can be avoided. (This condition, an alleviation of (d), will be represented by (d')).

The above described study confirmed that, as materials satisfying the conditions (a), (b), (c') and (d'), semiconductors represented by $(Al_{1-y}Ga_y)_{1-x}In_xP$ and $Ga_{1-z}In_zAs$ are respectively effective for top and bottom cells. $(Al_{1-y}Ga_y)_{1-x}In_xP$ and $Ga_{1-z}In_zAs$ could be found mostly because of the conditions (c') and (d'). With use of the structure of the present invention, all of the above conditions (a), (b), (c') and (d') can be satisfied. Consequently, a photoelectric converting device with a conversion efficiency of at least 30% can be achieved. Note that, in chemical composition representation, an element C occupies only x ($\leq 1.0$) of a site of C in a crystal grating with a chemical formula CP, while an element B occupies the remaining site of 1-x in the case of $B_{1-x}C_xP$ including B, C, and P. For $(A_{1-y}B_y)_{1-x}C_xP$, B occupies only $y(\leq 1.0)$ of a site of B in $B_{1-x}C_xP$, while A occupies the remaining 1-y For a Group III–V compound semiconductor of the present invention, InP, InAs, GaAs, GaP or the like generally has a zinc blende crystal structure. The zinc blende crystal structure is similar to a diamond structure of a semiconductor of Group IV like Ge, Si. In the photoelectric converting device of the present invention, composition ratio z, x and y of semiconductors $Ga_{1-z}In_zAs$ and $(Al_{1-y}Ga_y)_{1-x}In_xP$ desirably fall within $0.11<z<0.29$, $x=-0.346z^2+1.08z+0.484$ and $131z^3-66.0\ z^2+9.17z+0.309<y<28.0z^3-24.4z^2+5.82z+0.325$, respectively.

Specifically, the structure optimizes bandgap energies of the top cell and bottom cell materials. The present inventors have conducted calculations of lattice constants and bandgap energies for these semiconductors to find an optimum combination of $(Al_{1-y}Ga_y)_{1-x}In_xP$ and $Ga_{1-z}In_zAs$. FIG. 1 is a graph showing a range A of bandgap energies of top and bottom materials providing a photoelectric conversion efficiency of at least 34%. Referring to FIG. 1, the abscissa and ordinate respectively represents the bandgap energies of the top and bottom cell materials. In this graph, a region A, which is expected to provide a conversion efficiency of at least 30%, is represented as a region enclosed by a single closed curve. In FIG. 1, segments which are parallel to the abscissa show a relationship between the bottom and top cell bandgaps when the top cell material is a compound crystal with a given bottom cell material. Since the top cell is a compound crystal, the bandgap also has a range in accordance with a range allowing the compound crystal, which is represented as a segment. Shown on the right side of each segment are two semiconductor materials, i.e., a semiconductor material for the bottom cell and a compound crystal thereon. For the bottom cell listed therein, lattice mismatching to Ge is indicated as a percentage. For example, $Ga_{0.29}In_{0.71}P$—$Al_{0.30}In_{0.70}P$ on $Ga_{0.77}In_{0.23}As$ (1.62%>Ge) represents that the top cell is a compound crystal of $Ga_{0.29}In_{0.71}\ P$—$Al_{0.30}In_{0.70}P$ and the bottom cell is $Ga_{0.77}In_{0.23}As$. In addition, it indicates that the lattice constant of bottom cell $Ga_{0.77}In_{0.23}As$ is greater by 1.62% than that of GE. The ranges of $(Al_{1-y}Ga_y)_{1-x}In_xP$ and $Ga_{1-z}In_zAs$, respectively forming the top and bottom cells falling within region A of a conversion efficiency of at least 34%, are as follows.

z: a composition ratio z $Ga_{1-z}In_zAs$ for the bottom cell falls within $0.11<z<0.29$.

x, y: composition ratio x and y of $(Al_{1-y}Ga_y)_{1-x}In_xP$ for the top cell are respectively $x=-0.346z^2+1.08z+0.484$ and $131z^3-66.0z^2+9.17z+0.309<y<28.0z^3-24.4z^2+5.82z+0.325$, given that z is within the above mentioned range. The range of x is as shown in FIG. 2, according to composition ratio z of $Ga_{1-z}In_zAs$ for the bottom cell. The range of y is as shown in FIG. 3 according to composition ratio z of $Ga_{1-z}In_zAs$ for the bottom cell.

It is expected that a conversion efficiency of at least 34% is attained if composition ratios x, y and z of the top and bottom cell materials are within the above range. Further, if x, y and z are in the above range, lattice mismatching to Ge can be limited to below 2% if the substrate is of Ge. For a thermal expansion coefficient, three materials are very close to one another as Ge: $5.5 \times 10^{-6}$/K, $Ga_{1-z}In_zAs$: $5.8 \times 10^{-6}$/K and $(Al_{1-y}Ga_y)_{1-x}In_xP$: $4.8 \times 10^{-6}$/K, cracks would not be caused to or run through a layer.

The present invention is characterized in that a new material is used as a semiconductor material forming a solar cell by alleviation of the condition for lattice matching to the substrate. Namely, for the top cell, a new semiconductor is obtained based on the concept of compound crystal. In other words, the same crystal structure is used but elements forming the crystal are changed, or composition ratios of the elements are changed to provide a novel semiconductor. In general, for a compound semiconductor, it is well known that a compound crystal is obtained by mixing materials having the same crystal structure, a compound crystal with an intermediate characteristic in terms of lattice constant, bandgap energy or the like according to the ratio. Such a compound crystal is practically used for a device like an LED (Light Emitting Diode), laser diode or the like. In this case, the amount of added materials is not to the extent of mere doping of impurities, but is large enough to cause a composition change involving changes in crystal lattice constant, bandgap and the like. In this respect, the above described semiconductors $Ga_{1-z}In_zAs$ and $(Al_{1-y}Ga_y)_{1-x}In_xP$ manufactured based on the concept of compound crystal are novel.

Now, the difference between the present invention and the above mentioned United States Patents, of which concept the present invention is based, will be described in detail.

(1) The difference from U.S. Pat. No. 5,223,043

The above mentioned United States Patent discloses the following three combinations of materials for a two-junction solar cell.

(A) A combination of top cell $Ga_xIn_{1-x}P$ (0<x<0.5) and bottom cell GaAs (B) A combination of top cell $Ga_xIn_{1-x}P$ (x=0.51±0.05) and bottom cell GaAs (C) A combination of top cell $Ga_xIn_{1-x}P$ (0<x<0.5) and bottom cell $Ga_{x+0.5}In_{0.5-x}As$ (0<x<0.5)

Among the above combinations, (A) and (B) are on the premise that a layer is lattice-matched to a Ge substrate as stated previously. On the other hand, the layer of the present invention does not have to be necessarily lattice-matched to the Ge substrate as defined in (c'). The material of the top cell used for the photoelectric converting device of the present invention is different from that of the above mentioned United States Patent. Namely, $Al_{0.15}Ga_{0.15}In_{0.7}P$, a typical top cell material for the photoelectric converting device of the present invention, has 15% of Al, deviating from any of (A), (B) and (C) of the aforementioned United States Patent. In other words, in the present invention, a high conversion efficiency is attained by appropriately setting the bandgaps of the top and bottom cells with use of $(Al_{1-y}Ga_y)_{1-x}In_xP$ including Al for the top cell. To attain such a high conversion efficiency, a semiconductor material including at least a prescribed amount of Al as a material of the top cell must be used.

(2) The difference from U.S. Pat. No. 5,405,453

The above United States Patent discloses the following two combinations of materials for the two-junction solar cell.

(D) A combination of top cell (Ga, In) P (typically $Ga_{0.49}In_{0.51}P$) and bottom cell GaAs.

(E) A combination of top cell (Al, In) P (typically $Al_{0.55}In_{0.45}P$) and bottom cell GaAs.

The above (D) and (E) are combinations on the premise of lattice matching to a Ge substrate, which is basically different from the present invention in solar cell designing. In addition, both of the top cell and bottom cell are different from the present invention in materials used.

(3) Others

Other disclosure (Technical Digest of the International PVSEC-11, Sapporo, Hokkaido, Japan, 1999, p593–594) discloses the following combination.

(F) A combination of top cell $In_{0.49}Ga_{0.51}P$ and bottom cell $In_{0.01}Ga_{0.99}P$ The combination (F) provides for lattice matching to the Ge substrate with use of $In_{0.01}Ga_{0.99}P$ obtained by including In in GaAs by 1% to correct slight lattice mismatching between GaAs, a conventional bottom cell material, and Ge. Thus, the combination (F) is basically different from that of the solar cell of the present invention in designing. Further, both of the top and bottom cells are different from that of the solar cell of the present invention in materials used.

The present invention needs not be lattice-matched to the substrate as compared with the prior art of (A) to (F). In the present invention, a novel material $(Al_{1-y}Ga_y)_{1-x}In_xP$ is used for the top cell, and top and bottom cells both have set ranges of composition ratios of the materials used.

Desirably, the photoelectric converting device has a tunnel conjunction of $(Al_{1-y}Ga_y)_{1-x}In_xP$ and $Ga_{1-z}In_zAs$, for example.

The tunnel junction has a $p^+$ $n^+$ junction which is highly doped for electrically connecting the top and bottom cells. With such a structure, incident light with high energy at the top cell is partially converted to electrical energy, and light energy decreased by an amount converted at the top cell is partially converted to electrical energy at the bottom cell. Namely, tandem conversion is performed. In addition, electrical energy would be hardly lost after the conversion because of the tunnel junction. Thus, electrical energy can be used by the photoelectric converting device with higher conversion efficiency.

The photoelectric converting device of the present invention has, for example, a buffer layer between a layer including first and second pn junctions formed on a substrate and the substrate, where the thermal expansion coefficient of the buffer layer may be at least that of the layer immediately above the buffer layer.

With such a structure, cracks can be restrained only in the buffer layer in case of temperature change from high temperature to low temperature when forming the layer by MOCVD (Metal Organic Chemical Vapor Deposition). Thus, cracks are not caused to or run through the layer.

In the photoelectric converting device of the present invention, the thermal expansion coefficient of the substrate is desirably smaller than that of the layer immediately above the buffer layer.

With such a structure, the buffer layer can more reliably prevent cracks. The lattice constant of the buffer layer material is close to those of the layer and substrate. Further, in the converting device where the buffer layer material has a thermal expansion coefficient at least equal to or smaller than that of the layer immediately above, the lattice constant of the buffer layer material is desirably matched to that of the layer immediately above the buffer layer. More specifically, it is desirable that the buffer layer material substantially includes $GaAs_{1-w}Sb_w$ (0.29<w<0.33), for example. The above mentioned composition ratio w can be appropriately selected within the range of 0.29<w<0.33 to provide lattice matching or slight lattice mismatching according to the value of composition ratio z (0.11<z<0.29) of $Ga_{1-z}In_zAs$.

In the photoelectric converting device of the present invention, for example, it is desirable that a layer including first and second pn junctions is formed on at least one of GaAs, Ge, and Si single crystal substrates.

With such a structure, a layer with good crystallinity is formed to easily provide a photoelectric converting device with higher conversion efficiency. In addition, the Ge single crystal of the substrate limits lattice mismatching to the substrate within 2%. Thus, a high-quality layer is produced by epitaxial growth, and still higher conversion efficiency can be achieved if a pn junction is also formed for the Ge.

In the photoelectric converting device of the present invention, for example, a layer including first and second pn junctions formed on the substrate can be provided above an $Si_{1-x}Ge_x$ compound crystal layer on the Si single crystal substrate.

With such a structure, lattice mismatching is alleviated and a layer can be formed with excellent crystallinity. In addition, the photoelectric converting device with higher conversion efficiency can be obtained with an inexpensive substrate.

In the photoelectric converting device of the present invention, for example, a pn junction can be further formed at an upper layer portion of the substrate where the layer including the first and second pn junctions is formed.

Such a structure provides for effective usage of light and enhanced photoelectric conversion efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the embodiments of the present invention will be described with reference to the drawings.

First Embodiment

Figure 1:
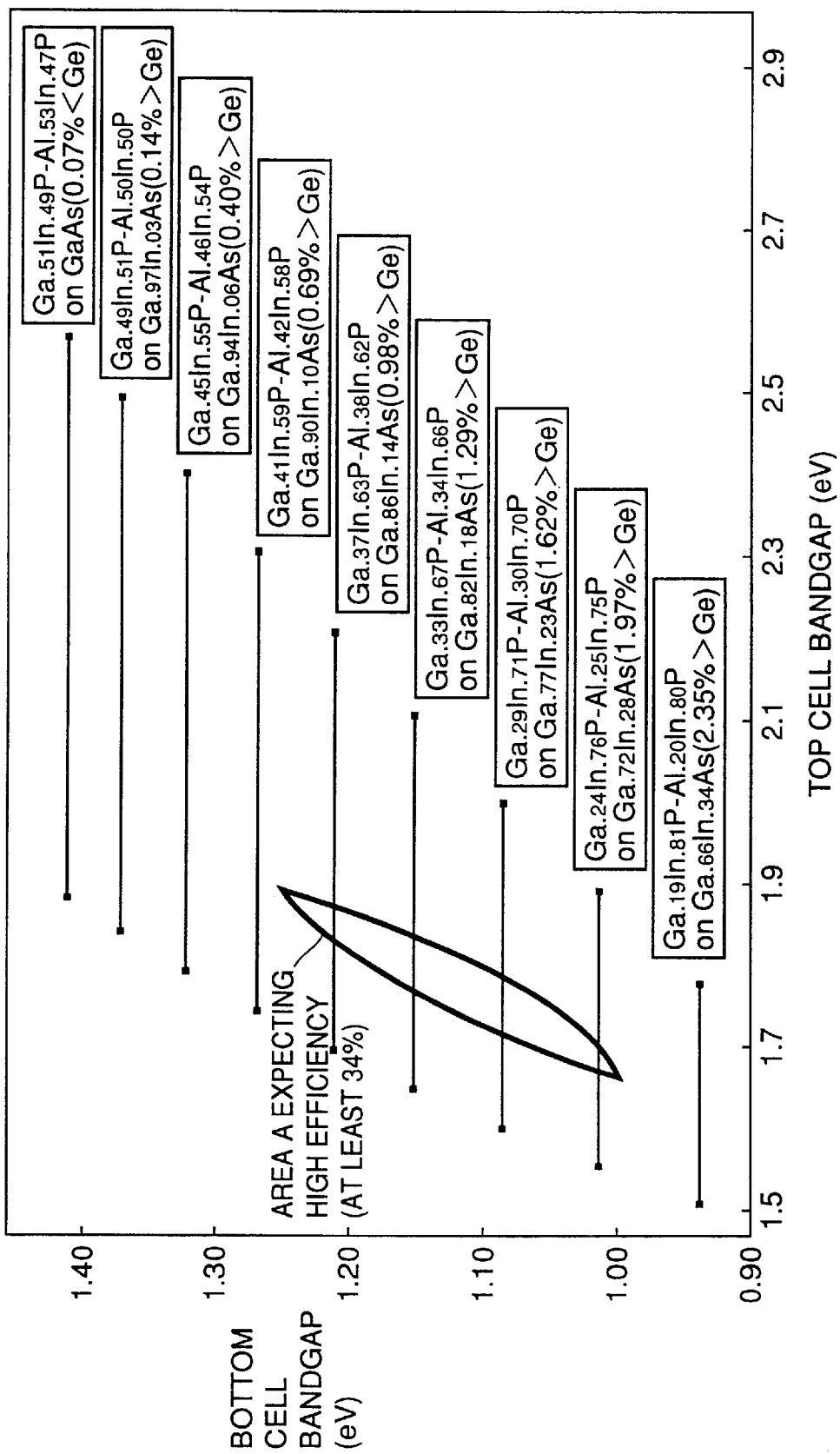
FIG. 1 is a diagram showing optimum composition ranges of top cell $(Al_{1-y}Ga_y)_{1-x}In_xP$ and bottom cell $Ga_{1-z}In_zAs$ of the present invention.
Figure 2:
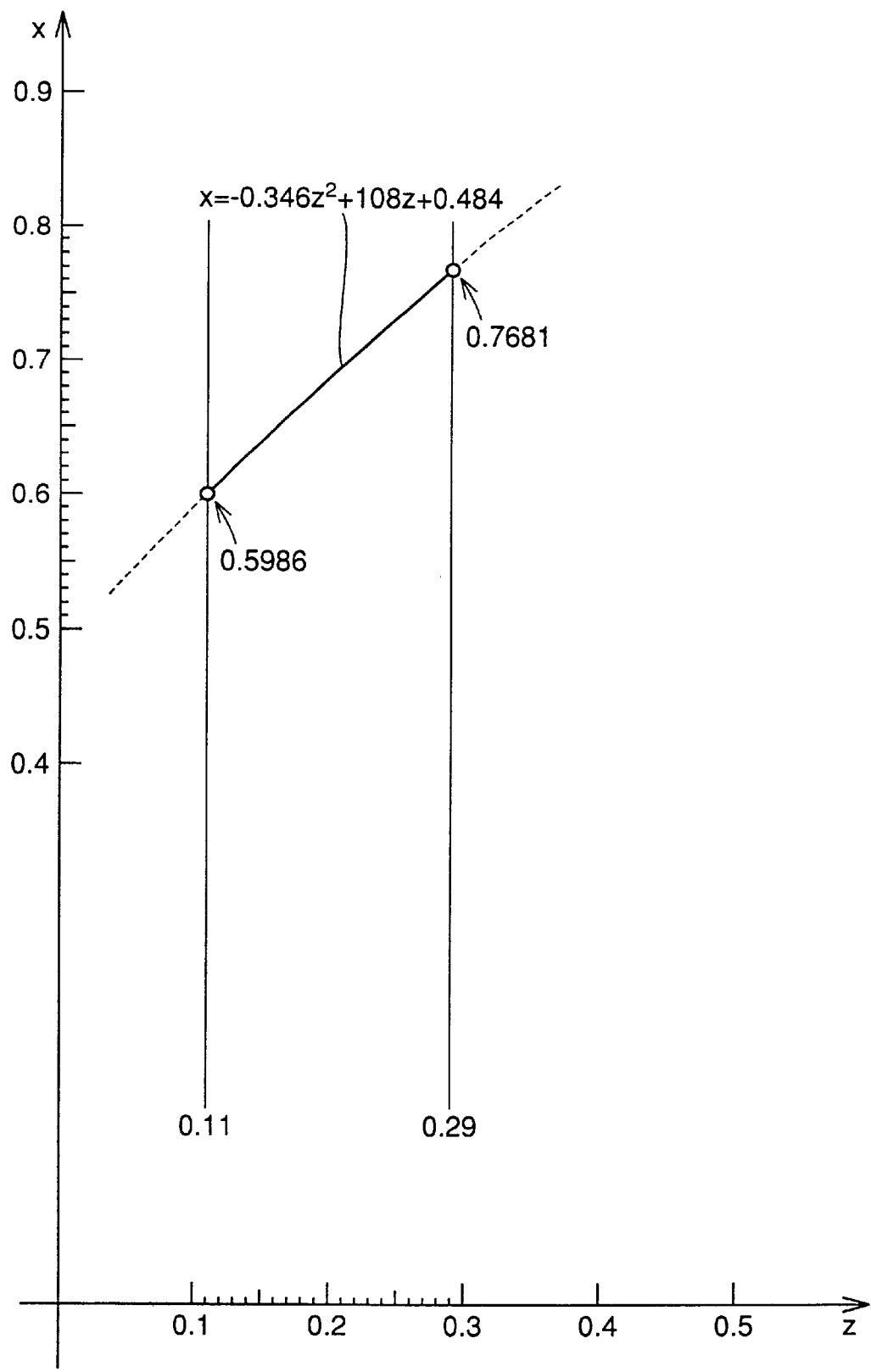
FIG. 2 is a graph showing a range of a composition ratio x of top cell $(Al_{1-y}Ga_y)_{1-x}In_xP$ according to composition ratio z of bottom cell $Ga_{1-z}In_zAs$.
Figure 3:
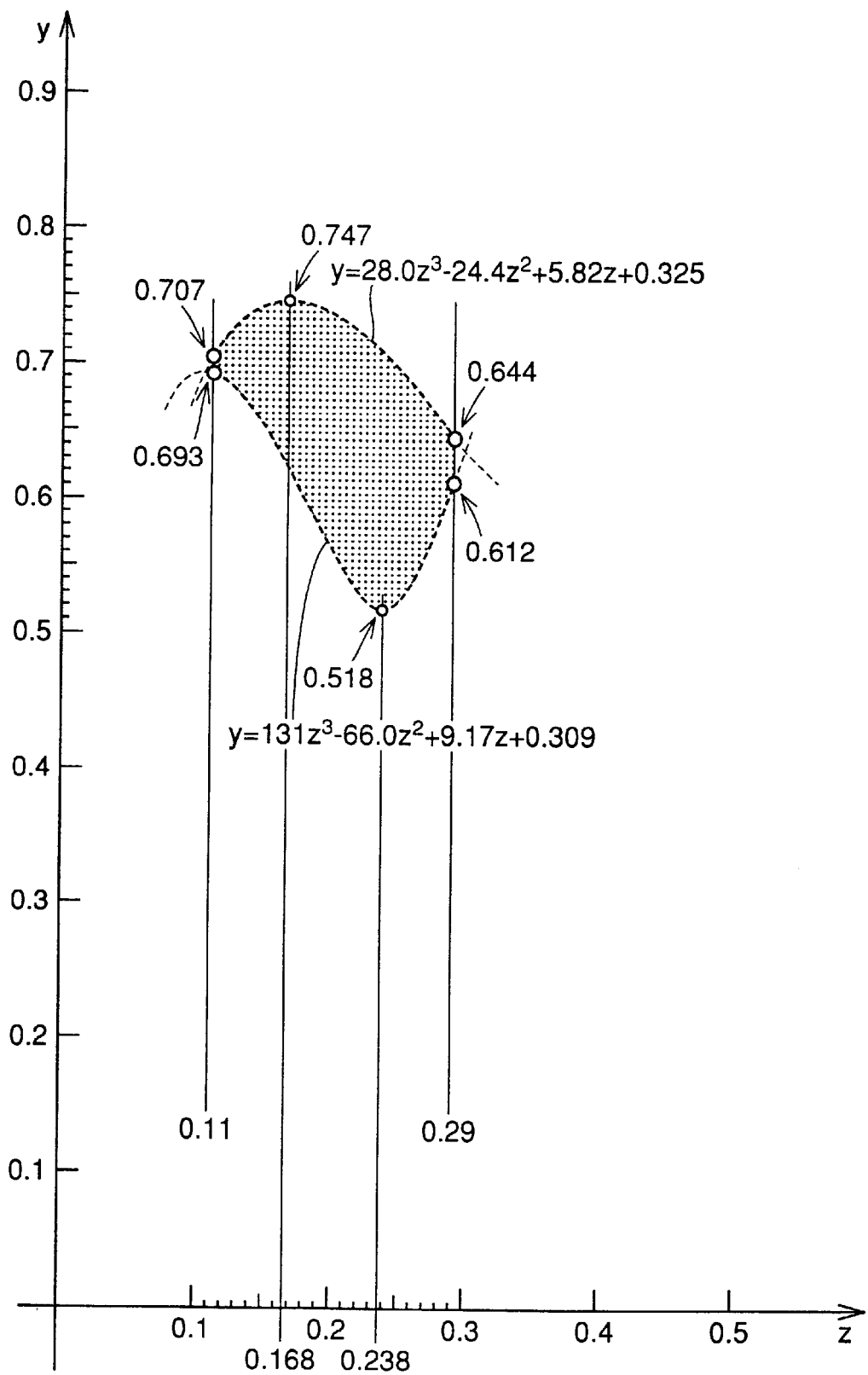
FIG. 3 is a graph showing a range of composition ratio y of top cell $(Al_{1-y}Ga_y)_{1-x}In_xP$ according to composition ration of bottom cell $Ga_{1-z}In_zAs$.
Figure 4:
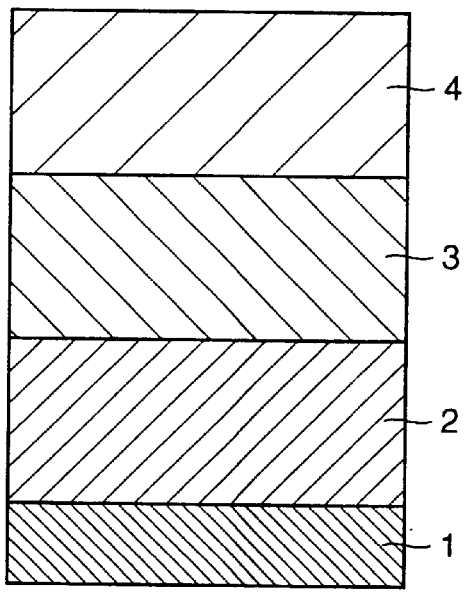
FIG. 4 is a cross sectional view showing a basic structure of a multi-junction solar cell of Group III–V compound semiconductor according to the first embodiment.

FIG. 4 is a cross sectional view showing a basic structure of a photoelectric converting device according to the first embodiment of the present invention. An incident direction of light 10 is shown in FIG. 4. The light incident side of each layer will be hereinafter defined as "surface" or "top layer" of each layer, and the opposing side as "back surface." In the basic structure of FIG. 4, the bottom cell 2, tunnel junction 3 and top cell 4 are sequentially layered on substrate 1 as a stack. MOCVD (Metal Organics Chemical Vapor Deposition) using metal organics or MBE (Molecular Beam Epitaxy) is used to form the stack. Ge single crystal may be used for substrate 1. Alternatively, for the purpose of reducing cost, an "epitaxial substrate" obtained by epitaxial growth of a compound crystal like Ge or $Si_{1-x}Ge_x$ on an Si substrate may be used. Alternatively, a three-junction structure with pn junctions formed in these substrates may be employed, or a potential barrier may be formed by a hetero-junction with a bottom cell material immediately above.

A bottom cell 2 includes a junction of p and n layers, i.e., a pn junction of materials at least having a composition $Ga_{1-z}In_zAs$ (0.11<z<0.29). By providing a known window layer on the surface side and a known back surface electrical field layer or the like on the back side through the pn junction, for example, the carrier collecting efficiency of the bottom cell can be improved. In addition, a buffer layer may be provided for preventing diffusion of substrate elements or impurities from substrate 1.

A tunnel junction 3 is a highly doped pn junction for electrically connecting the top and bottom cells, including at least one pair of $p^+$ and $n^+$ layers. As is known, another pair of layers may be provided for preventing diffusion of impurities from the highly doped layer between the $p^+$ and $n^+$ layers. The material of the tunnel junction may be $Ga_{1-z}In_zAs$ or $(Al_{1-y}Ga_y)_{1-x}In_xP$, or a semiconductor material of another composition.

Top cell 4 includes p and n layers of a material at least having a composition $(Al_{1-y}Ga_y)_{1-x}In_xP$. Note that x and y are defined as $x=-0.346z^2+1.08z+0.484$ and $131z^3-66.0.z^2+9.17z+0.309<y<28.0z^3-24.4z^2+5.82z+0.325$ with respect to composition ratio z (0.11<z<0.29) in the bottom cell. Needless to say, in top cell 4, by providing a known window layer on the surface side and a known back surface electrical field layer or the like on the back side through the pn junction, for example, the carrier collecting efficiency of the top cell can be improved.

Figure 5:
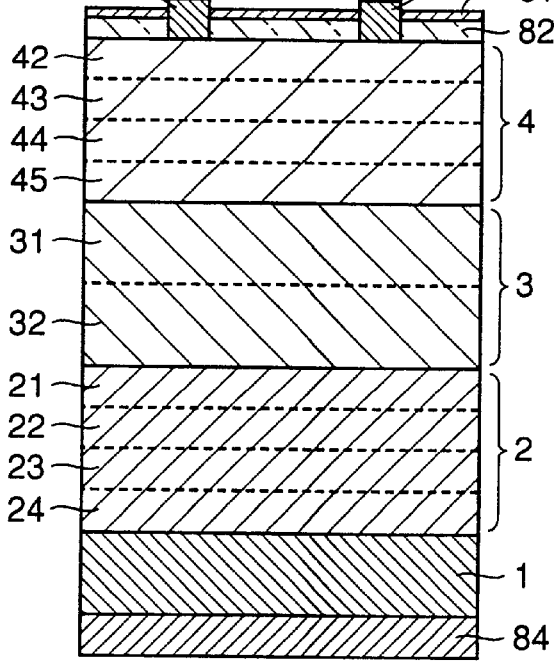
FIG. 5 is a cross sectional view showing in detail the multi-junction solar cell of Group III–V compound semiconductor of the first embodiment.

FIG. 5 is a cross sectional view showing in detail a photoelectric converting device derived from the basic structure of FIG. 4. In FIG. 5, a bottom cell 2 includes an n type window layer 21, an n type $Ga_{1-z}In_zAs$ layer 22, a p type $Ga_{1-z}In_zAs$ layer 23, and a $p^+$ type back surface electrical field layer 24. Top cell 4 includes an n type window layer 42, an n type $(Al_{1-y}Ga_y)_{1-x}In_xP$ layer 43, a p type $(Al_{1-y}Ga_y)_{1-x}In_xP$ layer 44, and $p^+$ type back surface electrical field layer 45. Further, anti-reflection films 81, 82 and an n type cap 41a are formed on the surface side, and surface electrode 83 and back surface electrode 84 for receiving electrical energy are provided.

Figure 6:
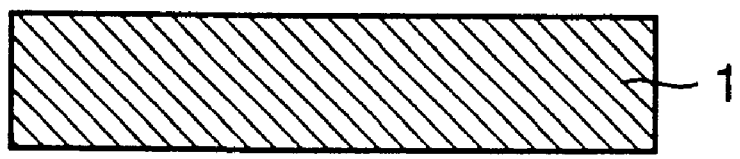
FIG. 6 is a cross sectional view showing a substrate of the multi-junction solar cell shown in FIG. 5.
Figure 7:
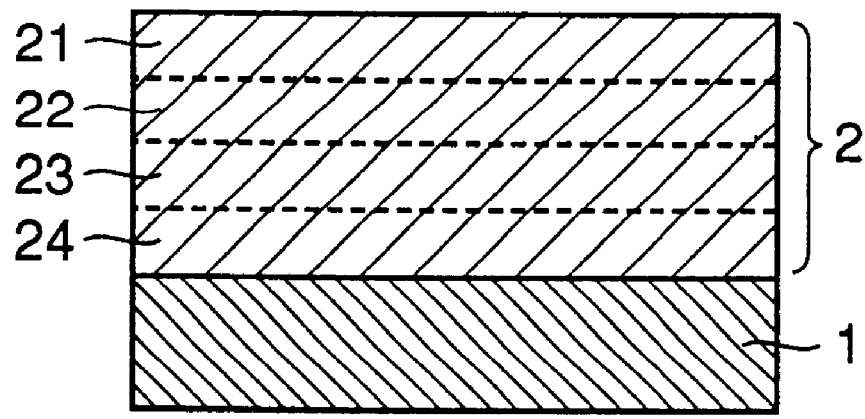
FIG. 7 is a cross sectional view showing a bottom cell formed on the substrate of FIG. 6.
Figure 8:
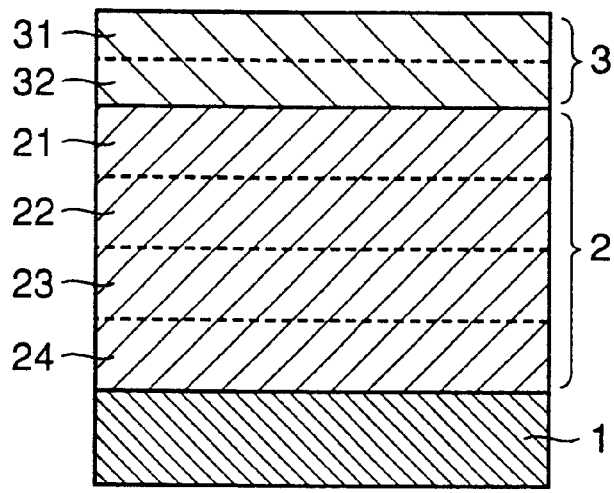
FIG. 8 is a cross sectional view showing a tunnel junction formed on the structure of FIG. 7.
Figure 9:
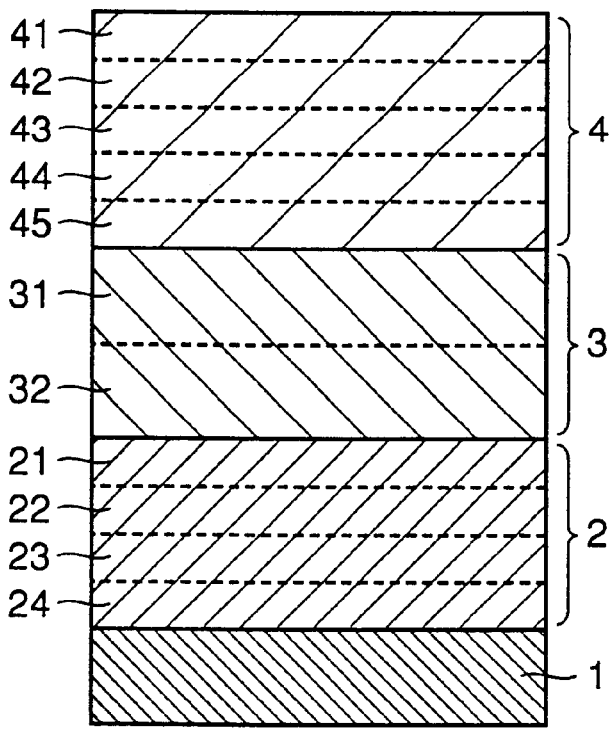
FIG. 9 is a cross sectional view showing a top cell formed on the structure of FIG. 8.

Now, a method of manufacturing the photoelectric converting device shown in FIG. 5 will be described with reference to FIGS. 6 to 9. In the manufacturing method, a film-forming process or the like are successively performed with use of an MOCVD apparatus. As a Group III material, metal organics like trimethyl gallium, trimethyl aluminum, or trimethyl indium is supplied to a film-forming apparatus with hydrogen as a carrier gas. For a Group V material, a gas like arsine ($AsH_3$), phosphine ($PH_3$) or stibine ($SbH_3$) is used. As a p type impurity or n type impurity dopant, diethyl zinc is used for p type, and monosilane ($SiH_4$), disilane ($Si_2H_6$), dihydroselenium ($H_2Se$) or the like is used for n type, by way of example. These material gases are subjected to thermal decomposition as supplied onto the substrate which is heated to 700° C. for example, so that a film of a desired compound semiconductor material can be formed by epitaxial growth. The composition of the layer and thickness of the layer can be respectively controlled by the composition of the gas introduced or a gas introducing time. FIG. 6 is a cross sectional view showing a p type Ge substrate 1 on which a layer is formed. First, as shown in FIG. 7, bottom cell 2 is formed on p type Ge substrate 1 by MOCVD. Bottom cell 2 has an n type window layer 21, n type $Ga_{1-z}In_zAs$ layer 22, p type $Ga_{1-z}In_zAs$ layer 23, and $p^+$ type back surface electrical field layer 24, in a decreasing order. The materials of n type window layer 21 and $p^+$ type back surface electrical field layer 24 can be appropriately selected, by considering a conversion efficiency of the bottom cell, from materials lattice-matched to two $Ga_{1-z}In_zAs$ layers 22, 23. Accordingly, for example, n type $(Al_{1-y}Ga_y)_{1-x}In_xP$ layer and $p^+$ type $Ga_{1-z}In_zAs$ layer 24 can be respectively selected as n type window layer 21 and $p^+$ type back surface electrical field layer 24. Next, as shown in FIG. 8, a tunnel junction 3 is formed on bottom cell 2. Tunnel junction 3 includes $p^+$ type $(Al_{1-y}Ga_y)_{1-x}In_xP$ 31 and $n^+$ type $(Al_{1-y}Ga_y)_{1-x}In_xP$ 32. Then, as shown in FIG. 9, top cell 4 is formed. Top cell 4 has n type cap layer 41, n type window layer 42, n type $(Al_{1-y}Ga_y)_{1-x}In_xP$ layer 43, p type $(Al_{1-y}Ga_y)_{1-x}In_xP$ layer 44, and $p^+$ type back surface electrical field layer 45. N type cap layer 41 is formed on n type window layer 42 for stronger ohmic contact of an n electrode. The materials of n type window layer 42 and $p^+$ type back surface electrical field layer 45 can be appropriately selected, by considering a conversion efficiency of the top cell, from materials lattice-matched to $(Al_{1-y}Ga_y)_{1-x}In_xP$ layer. Thus, for example, an n type $(Al_{1-y}Ga_y)_{1-x}In_xP$ layer including less amount of In and a $p^+$ type $(Al_{1-y}Ga_y)_{1-x}In_xP$ layer are respectively used as n type window layer 42 and $p^+$ type back surface electrical field layer 45. Examples of n type cap layer 41 include $n^+$ type $Ga_{1-z}In_zAs$ layer. Thereafter, n type cap layer 41 is selectively etched away to form n type cap 41a. Two layers of anti-reflection films 81, 82 are formed on the surface of top cell 41, and metal electrode films 83, 84 are formed on the outermost surface and back surface by vacuum deposition or sputtering to complete a photoelectric converting device shown in FIG. 5.

Second Embodiment

Figure 10:
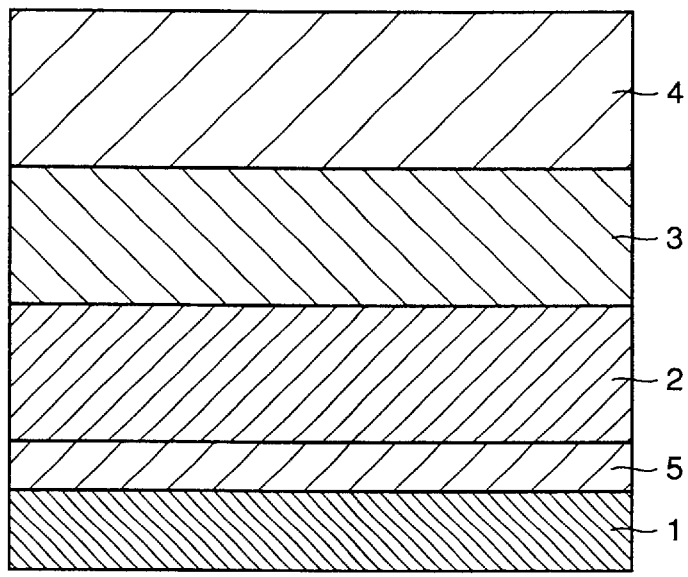
FIG. 10 is a cross sectional view showing a basic structure of a multi-junction solar cell of Group III–V compound semiconductor according to the second embodiment.

In the second embodiment of the present invention, a buffer layer 5 is provided between a substrate 1 and a bottom cell 2. Referring to FIG. 10, buffer layer 5 includes a material having a lattice constant close to those of a layer and substrate and having a thermal expansion coefficient which is at least equal to that of the material of the layer formed immediately above the buffer layer, i.e., the outermost layer of the bottom cell. Buffer layer 5 is intended to restrain cracks caused by the difference in thermal expansion coefficient of substrate 1 and the layer within the buffer layer when the temperature decreases after crystal growth and also prevents cracks in the layer and running of the cracks into the layer. Thus, cracks are not caused to bottom cell 2, tunnel junction 3, and top cell 4. More desirably, the thermal expansion coefficient of the material of the layer formed immediately above the buffer layer is greater than that of the substrate. More specifically, the material of the buffer layer may be, for example, $(GaAs_{1-w}Sb_w)$ (0.29<w<0.33) with w being appropriately selected in accordance with composition range 0.11<z<0.29 of bottom cell material $Ga_{1-z}In_zAs$. Bottom cell 2, tunnel junction 3 and top cell 4 are the same as in the first embodiment.

Figure 11:
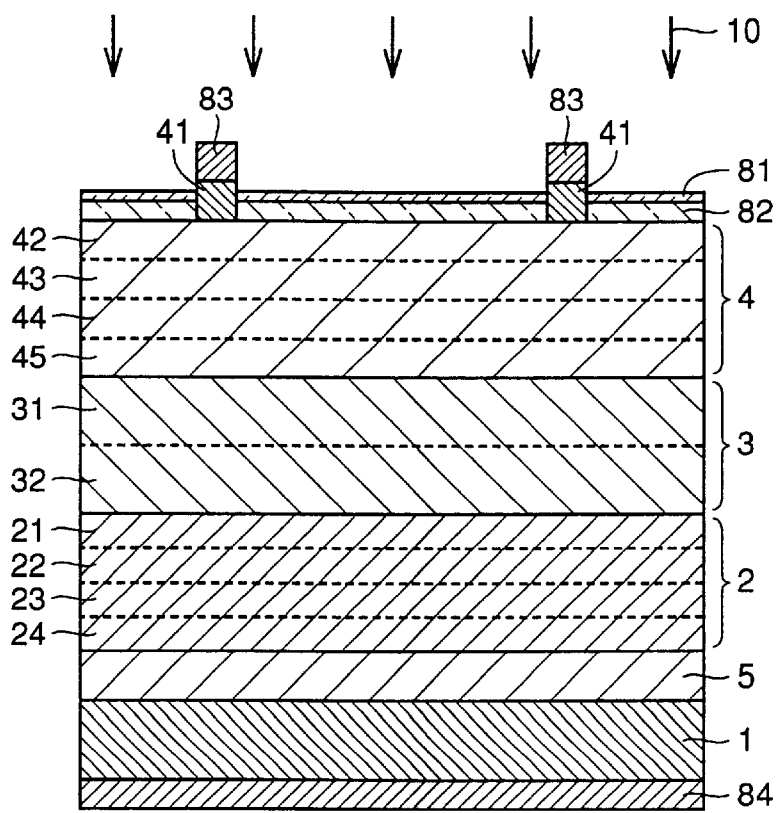
FIG. 11 is a cross sectional view showing in detail the multi-junction solar cell of Group III–V compound semiconductor of the second embodiment.

FIG. 11 shows in detail a photoelectric converting device based on the basic structure of the photoelectric converting device shown in FIG. 10. Bottom cell 2 and top cell 4, forming a multilayer structure, as well as anti-reflection films 81, 82 and electrodes 83, 84 are the same as in the first embodiment.

It is noted that the present invention involves selection of basic materials for providing a photoelectric converting device with high conversion efficiency by forming a multilayer structure including the top cell, tunnel junction and the bottom cell. Another tunnel junction may be provided between the buffer layer and the bottom cell, or another layer like a distortion alleviating layer may be inserted between the top cell and the tunnel junction or between the tunnel junction and bottom cell. These alternatives are naturally included in the scope of the present invention. In addition, given that the material selection falls within the scope of the present invention, the light receiving side may be of p type or n type.

By providing the buffer layer as in the present embodiment, cracks, which would be caused by the difference in thermal expansion coefficient of the photoelectric converting device when the temperature decreases after film formation process, can be restrained within the buffer layer. Thus, the yield increases and manufacturing cost decreases. By adjusting a lattice constant to achieve lattice matching to the layer immediately above, a layer with excellent crystallinity can be formed and photoelectric conversion efficiency increases.

Third Embodiment

Figure 12:
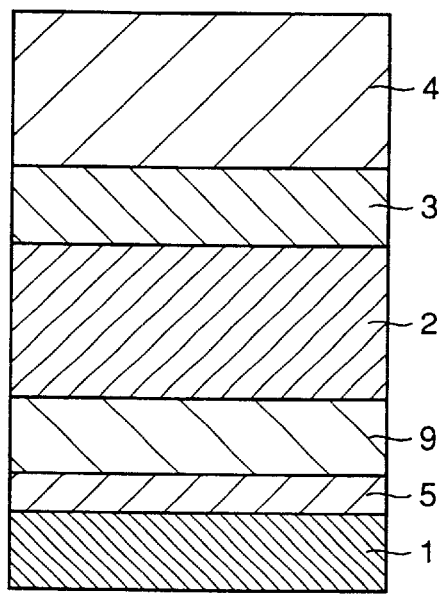
FIG. 12 is a cross sectional view showing a basic structure of a multi-junction solar cell of Group III–V compound semiconductor according to the third embodiment.
Figure 13:
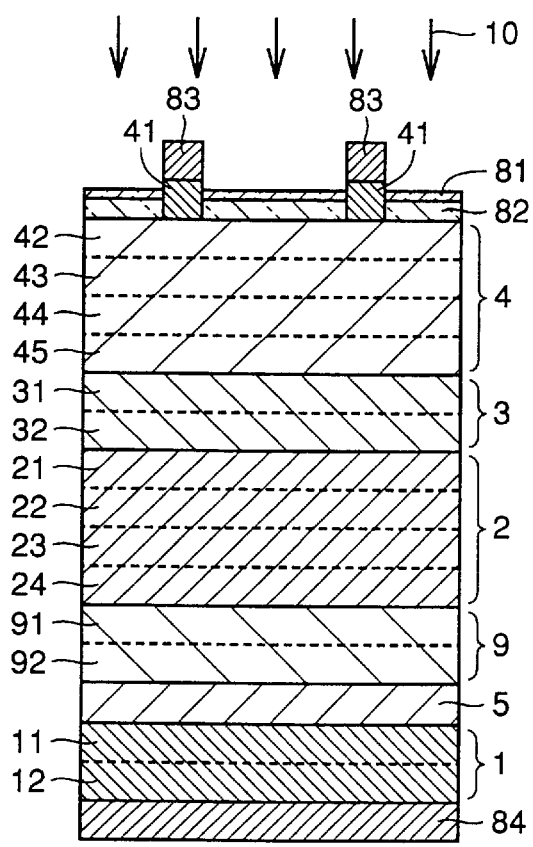
FIG. 13 is a cross sectional view showing in detail the multi-junction solar cell of group III–V compound semiconductor of the third embodiment.
Figure 14:
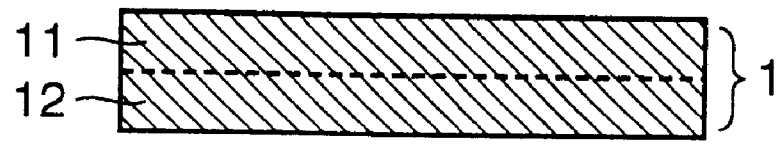
FIG. 14 is a cross sectional view showing a pn junction in a substrate by introducing n type impurities into the top portion of a p type substrate of the multi-junction solar cell shown in FIG. 13.
Figure 15:
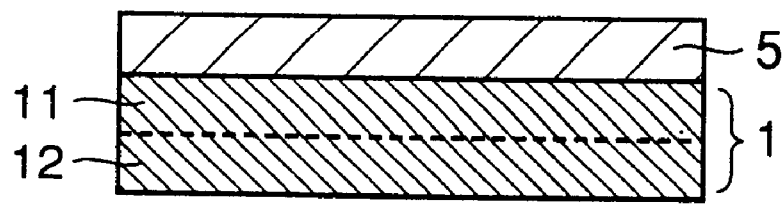
FIG. 15 is a cross sectional view showing a buffer layer formed on the structure of FIG. 14.
Figure 16:
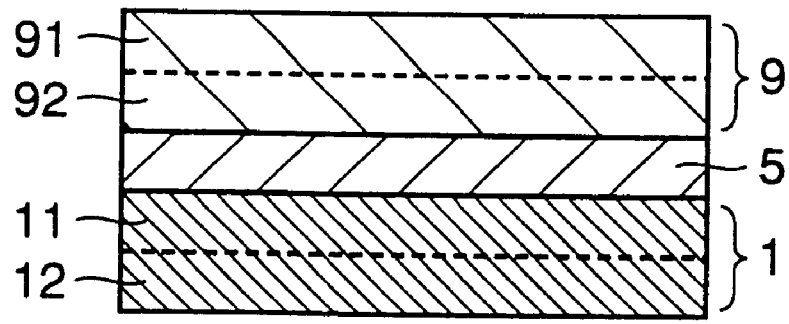
FIG. 16 is a cross sectional view showing a tunnel junction formed on the structure of FIG. 15.
Figure 17:
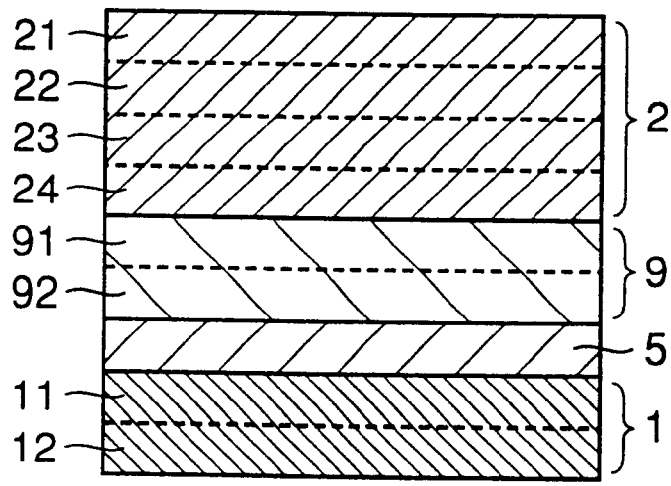
FIG. 17 is a cross sectional view showing a bottom cell formed on the structure of FIG. 16.
Figure 18:
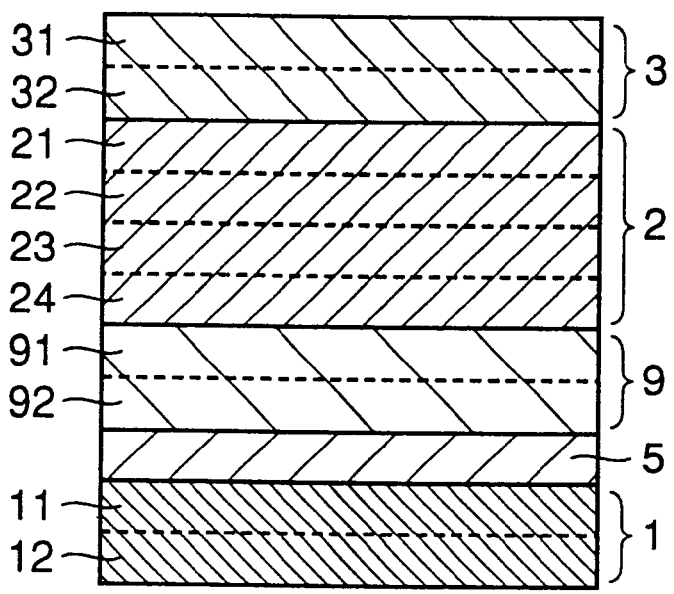
FIG. 18 is a cross sectional view showing a tunnel junction formed on the structure of FIG. 17.
Figure 19:
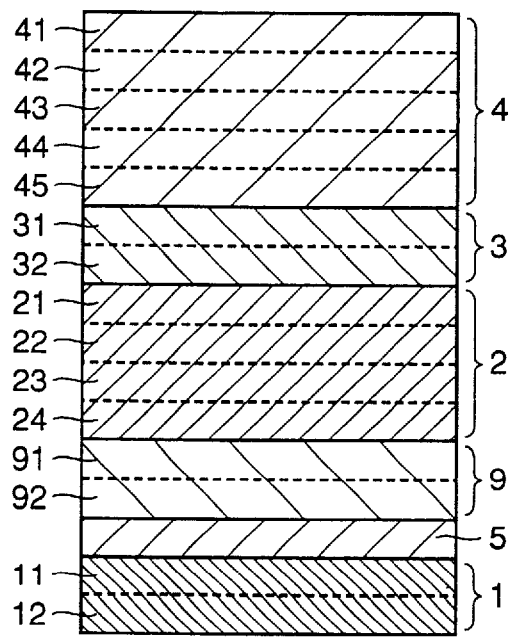
FIG. 19 is a cross sectional view showing a top cell formed on the structure of FIG. 18.
Figure 20:
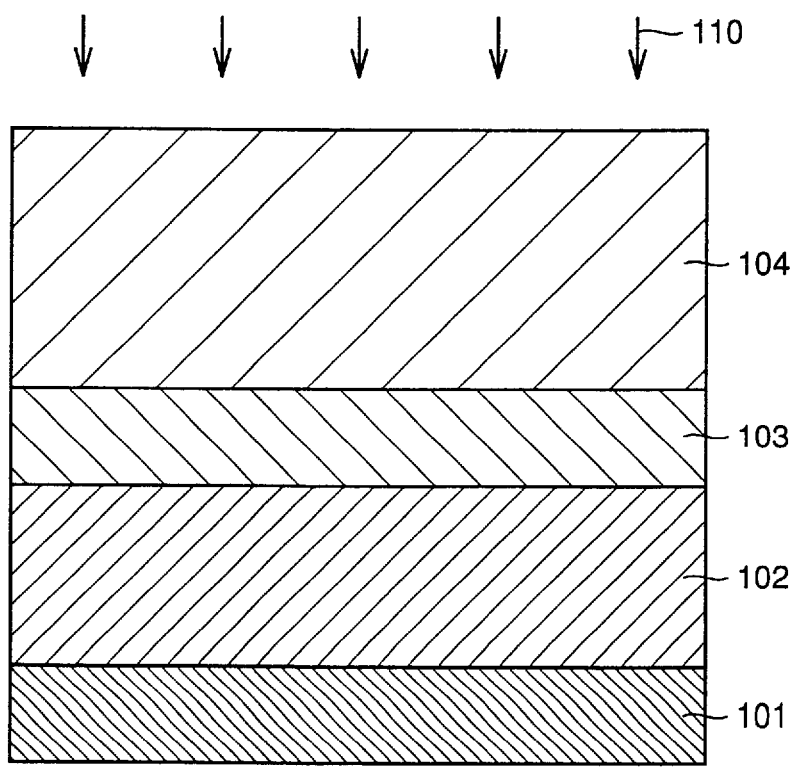
FIG. 20 is a cross sectional view showing a basic structure of a multi-junction solar cell of a conventional Group III–V compound semiconductor.
Figure 21:
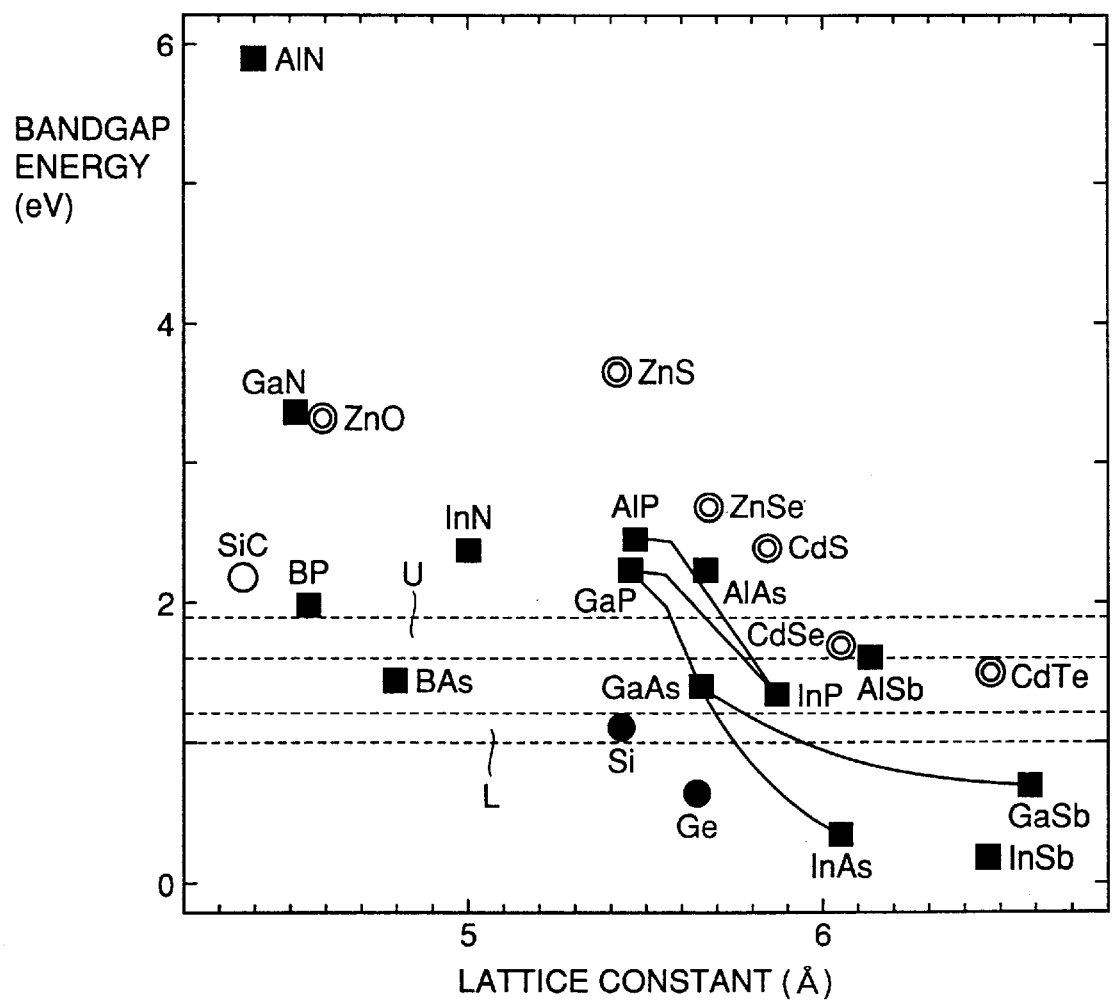
FIG. 21 is a diagram showing a relationship between a lattice constant and bandgap energy of various semiconductors.

A photoelectric converting device of the third embodiment of the present invention has a pn junction in a substrate outer layer and further includes a tunnel junction 9 between buffer layer 5 and bottom cell 2. FIG. 13 is a cross sectional view showing in detail a photoelectric converting device based on the basic structure of FIG. 12. Referring to FIGS. 14 to 19, a method of manufacturing the photoelectric converting device shown in FIG. 13 will be described. FIG. 14 shows a p type Ge substrate 1. A cell structure is formed thereon. By diffusing As during epitaxial growth, a thin n type layer 11 is formed on p type Ge substrate 12. Then, as shown in FIG. 15, a buffer layer 5 is formed on substrate 1 by MOCVD. The examples of the materials for the buffer layer include n type $GaAs_{1-w}Sb_w$ (0.29<w<0.33). As shown in FIG. 16, a tunnel junction 9 is newly formed. Examples of tunnel junction 9 include for example $p^+$ type $Ga_{1-z}In_zAs$ 91 and $n^+$ type $Ga_{1-z}In_zAs$ 92. Then, a bottom cell 2 is formed as shown in FIG. 17. Bottom cell 2 includes an n type window layer 21, n type $Ga_{1-z}In_zAs$ layer 22, p type $Ga_{1-z}In_zAs$ layer 23, and $p^+$ type back surface electrical field layer 24. The materials of n type window layer 21 and $p^+$ type back surface electrical field layer 24 can be appropriately selected by considering conversion efficiency of the bottom cell from the materials lattice-matched to $Ga_{1-z}In_zAs$ layers 22, 23. For example, n type window layer 21 and $p^+$ type back surface electric field layer 24 may be n type $(Al_{1-y}Ga_y)_{1-x}In_xP$ and $p^+$ type $Ga_{1-z}In_zAs$, respectively. Then, as shown in FIG. 18, tunnel junction 3 is formed. Tunnel junction 3 includes $p^+$ type $(Al_{1-y}Ga_y)_{1-x}In_xP$ layer 31 and $n^+$ type $(Al_{1-y}Ga_y)_{1-x}In_xP$ layer 32. Then, as shown in FIG. 19, a top cell 4 is formed. Top cell 4 includes an n type window layer 42, n type $(Al_{1-y}Ga_y)_{1-x}In_xP$ layer 43, p type $(Al_{1-y}Ga_y)_{1-x}In_xP$ layer 44, and $p^+$ type back surface electrical field layer 45, in a decreasing order. Further, in the present embodiment, an n type cap layer 41 is provided for stronger ohmic contact of an n electrode. The materials of n type window layer 42 and $p^+$ type back surface electrical field layer 45 can be appropriately selected by considering conversion efficiency of the top cell from materials lattice-matched to $(Al_{1-y}Ga_y)_{1-x}In_xP$ layers 43, 44. For example, an n type $(Al_{1-y}Ga_y)_{1-x}In_xP$ layer including less amount of In and a $p^+$ type $(Al_{1-y}Ga_y)_{1-x}In_xP$ layer may be respectively used for n type window layer 42 and $p^+$ back surface electrical field layer 45. N type $Ga_{1-z}In_zAs$ may be used for n type cap layer 41, for example. Then, cap layer 41 is selectively etched away to form two layers of anti-reflection films 81, 82 on the back surface of the top cell. Finally, metal electrode films 83, 84 are formed by vacuum deposition or sputtering on the outermost surface and back surface to complete the photoelectric converting device shown in FIG. 13.

The above described photoelectric converting device includes a novel semiconductor material to yield a photoelectric conversion efficiency optimizing the combination of bandgaps of the top and bottom cells. Thus, a conversion efficiency considerably higher than that of a conventional photoelectric converting device using a Group III–V semiconductor can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photoelectric converting device comprising:
   first and second pn junctions, said first pn junction being formed in a semiconductor comprising $(Al_{1-y}Ga_y)_{1-x}In_xP$, and said second pn junction being formed in a semiconductor comprising $Ga_{1-z}In_zAs$, and
   wherein composition ratios z, x and y of said semiconductors $Ga_{1-z}In_zAs$ and $(Al_{1-y}Ga_y)_{1-x}In_xP$ respectively fall within 0.11<z<0.29, $x=-0.346z^2+1.08z+0.484$ and $131z^3-66.0z^2+9.17z+0.309<y<28.0z^3-24.4z^2+5.82z+0.325$.

2. The photoelectric converting device according to claim 1, wherein said first and second pn junctions are connected by a tunnel junction.

3. The photoelectric converting device according to claim 1, further including a buffer layer between a substrate and said first and second pn junctions formed on said substrate, a thermal expansion coefficient of said buffer layer being at least equal to a thermal expansion coefficient of a layer immediately above said buffer layer.

4. The photoelectric converting device according to claim 2, further including a buffer layer between a substrate and said first and second pn junctions formed on said substrate, a thermal expansion coefficient of said buffer layer being at least equal to a thermal expansion coefficient of a layer immediately above said buffer layer.

5. The photoelectric converting device according to claim 3, wherein a thermal expansion coefficient of said substrate is smaller than that of the layer immediately above said buffer layer.

6. The photoelectric converting device according to claim 3, wherein a lattice constant of said buffer layer is lattice-matched to the layer immediately above said buffer layer.

7. The photoelectric converting device of claim 3, wherein said buffer layer comprises $GaAs_{1-w}Sb_w$ where w is in the range of $0.29<w<0.33$.

8. The photoelectric converting device of claim 4, wherein said buffer layer comprises $GaAs_{1-w}Sb_w$ where w is in the range of $0.29<w<0.33$.

9. The photoelectric converting device according to claim 1, wherein said first and second pn junctions are formed on one of a GaAs single-crystal substrate, a Ge single-crystal substrate, and a Si single-crystal substrate.

10. The photoelectric converting device according to claim 2, wherein said first and second pn junctions are formed on one of a GaAs single-crystal substrate, a Ge single-crystal substrate, and a Si single-crystal substrate.

11. The photoelectric converting device according to claim 1, wherein said first and second pn junctions are formed above a $Si_{1-x}Ge_x$ compound crystal layer that is provided on a Si single-crystal substrate.

12. The photoelectric converting device according to claim 2, wherein said first and second pn junctions are formed above a $Si_{1-x}Ge_x$ compound crystal layer that is provided on a Si single-crystal substrate.

* * * * *